United States Patent
Gao (10) Patent No.: US 11,903,165 B2
(45) Date of Patent: Feb. 13, 2024

(54) LIQUID COOLING NODES PACKAGING IN A SERVER CHASSIS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 108 days.

(21) Appl. No.: 17/483,707

(22) Filed: Sep. 23, 2021

(65) Prior Publication Data

US 2023/0092620 A1  Mar. 23, 2023

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |
| *H05K 7/14* | (2006.01) |

(52) U.S. Cl.
CPC ....... *H05K 7/20272* (2013.01); *H05K 7/1408* (2013.01); *H05K 7/1488* (2013.01); *H05K 7/1405* (2013.01)

(58) Field of Classification Search
CPC ............. H05K 7/20272; H05K 7/1408; H05K 7/1488; H05K 7/1405
See application file for complete search history.

(56) References Cited

U.S. PATENT DOCUMENTS

| | | | | |
|---|---|---|---|---|
| 7,961,475 | B2* | 6/2011 | Campbell | H05K 7/20772 361/752 |
| 9,261,308 | B2* | 2/2016 | Campbell | H05K 7/20772 |
| 9,462,728 | B2* | 10/2016 | Demange | H05K 7/20772 |
| 9,750,159 | B2* | 8/2017 | Campbell | H05K 7/20809 |
| 10,164,373 | B1* | 12/2018 | Cheon | H01R 13/005 |
| 11,129,292 | B1* | 9/2021 | Shao | H05K 7/1485 |
| 2006/0187638 | A1* | 8/2006 | Vinson | H05K 7/20009 361/698 |
| 2009/0161312 | A1* | 6/2009 | Spearing | H05K 7/20781 361/679.53 |
| 2011/0069453 | A1* | 3/2011 | Campbell | H05K 7/203 361/700 |
| 2011/0315353 | A1* | 12/2011 | Campbell | H05K 7/20809 165/104.31 |
| 2014/0124167 | A1* | 5/2014 | Campbell | H05K 7/20809 165/96 |

(Continued)

*Primary Examiner* — Anthony M Haughton
(74) *Attorney, Agent, or Firm* — WOMBLE BOND DICKINSON (US) LLP (57) ABSTRACT

A fluid distribution system is incorporated into a server chassis. Connector plates have fluid connectors designed to connect with fluid cooling receptacles on server boards. A linkage system can be manually manipulated to translate the connector plates so as to engage the electronics boards and connect the fluid connectors to the receptacle. A pair of main connectors connect to the rack's fluid manifold to circulate cooling fluid to cool devices mounted onto the server boards. A locking mechanism can be included to mechanically lock the chassis to the rack to prevent accidental dismount of the chassis from the rack. Also, an anchor mechanism may be provided to apply counter force when engaging the connector plates with the server boards so as to prevent accidental dismount of the server board by the moving connector plate.

20 Claims, 9 Drawing Sheets

(56) References Cited

U.S. PATENT DOCUMENTS

| | | | |
|---|---|---|---|
| 2016/0066480 A1* | 3/2016 | Eckberg | F16L 37/34 |
| | | | 361/679.53 |
| 2017/0127575 A1* | 5/2017 | Lunsman | H05K 7/20263 |
| 2017/0257980 A1* | 9/2017 | Fukunaga | F16L 37/40 |
| 2020/0178413 A1* | 6/2020 | Thibaut | H05K 7/1452 |
| 2022/0287197 A1* | 9/2022 | Gao | H05K 7/20272 |
| 2023/0085165 A1* | 3/2023 | Gao | H05K 7/20272 |
| | | | 361/699 |
| 2023/0301021 A1* | 9/2023 | Gao | H05K 7/20272 |
| | | | 361/679.53 |

* cited by examiner

LIQUID COOLING NODES PACKAGING IN A SERVER CHASSIS

FIELD OF THE INVENTION

Embodiments of the present invention relate generally to liquid cooling of servers, specifically to hardware architecture for fluid distribution to servers in a chassis.

BACKGROUND

Server farms generally house rows of server racks, into which server chassis are mounted. Many advanced servers require liquid cooling, as simple air-based cooling is insufficient to properly remove the amount of heat generated by these servers. Consequently, various arrangements have been utilized for liquid-based cooling of the servers. Traditionally, server racks are designed to accommodate several levels of server chassis according to the indicated rack unit height, as "Rack Unit" being equal to 1.75" in height as an example. The rack is generally designed to accept server chassis loaded from the front of the rack and provide utilities from the back of the rack. For liquid cooling, a manifold may be attached to the back of the rack and various flexible hoses are used to circulate liquid to the various servers.

Having manifolds with many flexible hoses to circulate liquid to servers presents many difficulties both in installation and maintenance of the systems. First, maintaining order and matching of the hoses and servers makes the installation complex, time consuming and cumbersome. Second, having a bunch of loose hoses at the back of each rack drastically degrades the reliability of the entire system. Also, such an approach limits the power density of the servers loaded onto the rack, since the cooling capacity using the hoses is limited.

Accordingly, a solution is needed for efficient liquid circulation to servers, which enables easy installation and loading of servers, while also simplifies maintenance and access.

BRIEF DESCRIPTION OF THE DRAWINGS

Embodiments of the invention are illustrated by way of example and not limitation in the figures of the accompanying drawings, which are not to scale and in which like references indicate similar elements.

FIG. 2A is a schematic illustrating another embodiment of a fluid supply unit incorporated in a server chassis, while

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Incidentally, in the following embodiments similar elements are identified with similar reference numbers in the formal x ##, wherein the first digit x is replaced by the same digit as the figure number, while the next two digits ##are maintained consistent among the embodiments. Consequently, explanation of previously disclosed elements may not be repeated in subsequent embodiments.

Disclosed embodiments provide a rack architecture with fluid distribution unit integrated into the chassis for liquid cooled servers. The design includes cooling hardware that enables loading boards from front and backside of the chassis. Disclosed embodiments solve the high power density server and rack liquid cooling design challenges, and enable easy deployment and service of the liquid cooled servers. With these new designs, efficient fluid distribution and management are enabled, which can accommodate different server and rack architectures.

The modern server architecture may include more and more PCIE devices or blade based devices coexisting and co-packing within a chassis. The disclosed embodiments efficiently solve the challenges for deploying liquid cooling hardware and designing fluid distribution and recirculation for liquid cooling implementation for these devices.

In disclosed embodiments, a fluid distribution system is incorporated into a server chassis. Connector plates have fluid connectors designed to connect with fluid cooling receptacles on server boards. A linkage system can be manually manipulated to translate the connector plates so as to engage the server boards and connect the fluid connectors to the receptacles. A pair of main connectors connect to the rack's fluid manifold to circulate cooling fluid to cool devices mounted onto the server boards. A locking mechanism can be included to mechanically lock the chassis to the rack to prevent accidental dismount of the chassis from the rack. Also, an anchor mechanism may be provided to apply counter force when engaging the connector plates with the server boards so as to prevent accidental dismount of the server boards by the moving connector plates.

According to disclosed embodiments, a fluid management module is incorporated into a rack for deploying and operating multiple server electronics boards. The fluid management module includes multiple connectors attached onto a movable plate located in the middle of the chassis. The connectors are designed for mating with electronics board connectors when the plate is moved to engage the electronic boards. The management module includes built-in fluid hardware loops which are segregated from the electronics board. A locking assembly is designed to secure the chassis to the rack to prevent accidental dismount. The rear side of the connectors are designed to be engaged with the rack fluid system connectors. The entire server chassis with the fluid management module enable efficient fluid recirculation solution for designing a chassis for multiple heterogeneous server electronics boards.

Figure 1:
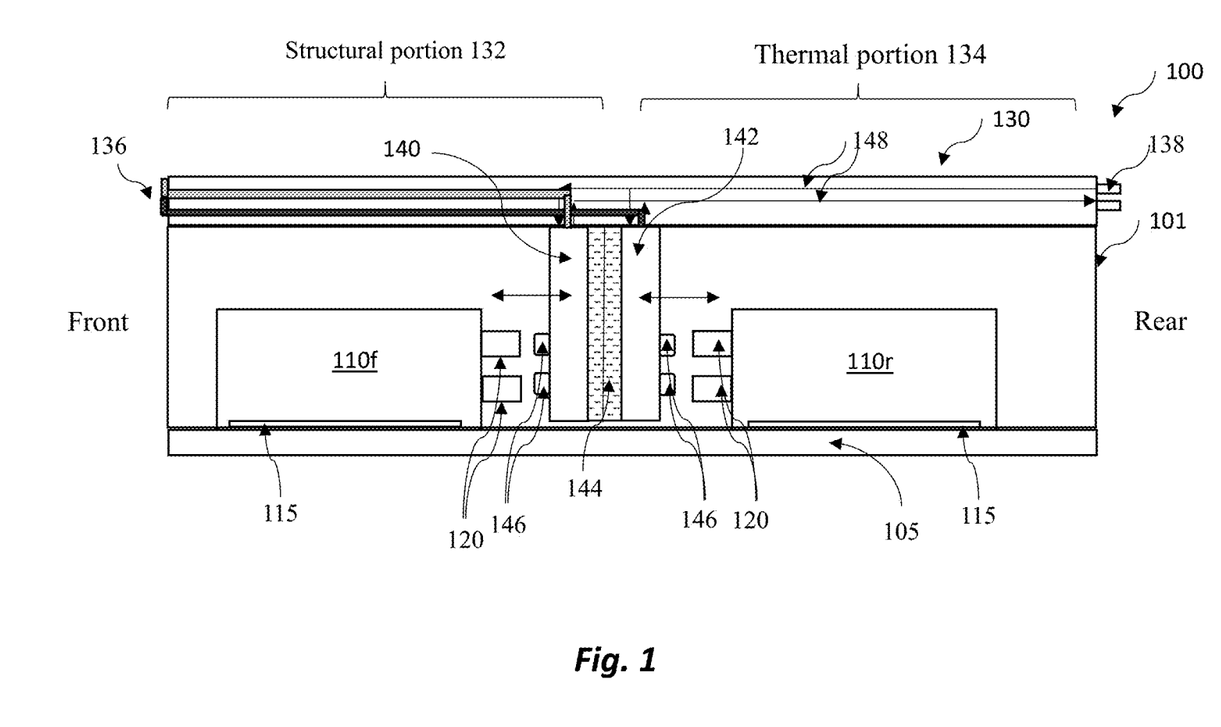
FIG. 1 is a general diagram of a fluid supply unit incorporated in a server chassis, according to an embodiment.

FIG. 1 is a general diagram of a chassis 100 having integrated fluid distribution for server nodes loaded from the front and from the back of the chassis 100, according to an embodiment. In FIG. 1, the chassis housing 101 includes a base 105 that is configured to support server nodes 110*f* loaded from the front side and server nodes 110*r* loaded from the rear side. Each of the server nodes include electronic boards 115 and cooling fluid connectors 120 to deliver liquid cooling to high performance devices mounted onto the boards 115. Chassis 100 also has an integrated fluid distribution module 130, which includes a structural/mechanical portion 132 in the front and a thermal portion 134 at the rear of the chassis 100. An engagement mechanism 136 is provided in the front of the structural portion 132, and main fluid connectors 138 are provided at the rear of the thermal portion 134. The main fluid connectors 138 are provided at the rear so as to facilitate connection to the main manifold, which is generally provided at the back of the rack into which the chassis is installed. That is, when installed, the rear of the chassis is at the rear of the rack.

The fluid from the main connectors 138 is circulated to the servers as follows. A front connector plate 140 and a rear connector plate 142 are coupled to the structural portion 132 and can be translated or moved horizontally (see double-headed arrow) using the engagement mechanism 136. Each of the front connector plate 140 and the rear connector plate 142 includes mating connectors 146, which are configured to engage and connect with fluid connectors 120. In one embodiment, the connectors 120 and mating connectors 146 are blind mating dripless connectors. Fluid lines 148, which may be a combination of pipes and hoses, lead from the main connectors 138 to the mating connectors 146. Note that all of the connectors shown are paired connectors, since one connector handles fluid supply and one connector handles fluid return. Similarly, the fluid lines are also paired, one for supply line and one for return line.

The embodiment of FIG. 1 is further enhanced by the provision of intermediate plate 144. Intermediate plate 144 enables the mounting of different connecting plates 140 and 142 according to different designs of the server boards 110*f* and 110*r*. This provides flexibility in deployment, since the entire structural and thermal portions can be integrated using a single design, while depending on the particular design of the electronic boards to be installed in the chassis, different connector plates can be attached to the intermediate plate. For example, the use of the intermediate plate 144 enables designing the engagement hardware and structure between the intermediate plate 144 and the structural portion 132 of the fluid distribution module 130, whereby the structure of the connector plates 140 and 142 can be simplified. Conversely, in one embodiment, the connector plate 144 only functions as a supporting structure for the connector plates 140 and 142.

Figure 2A:
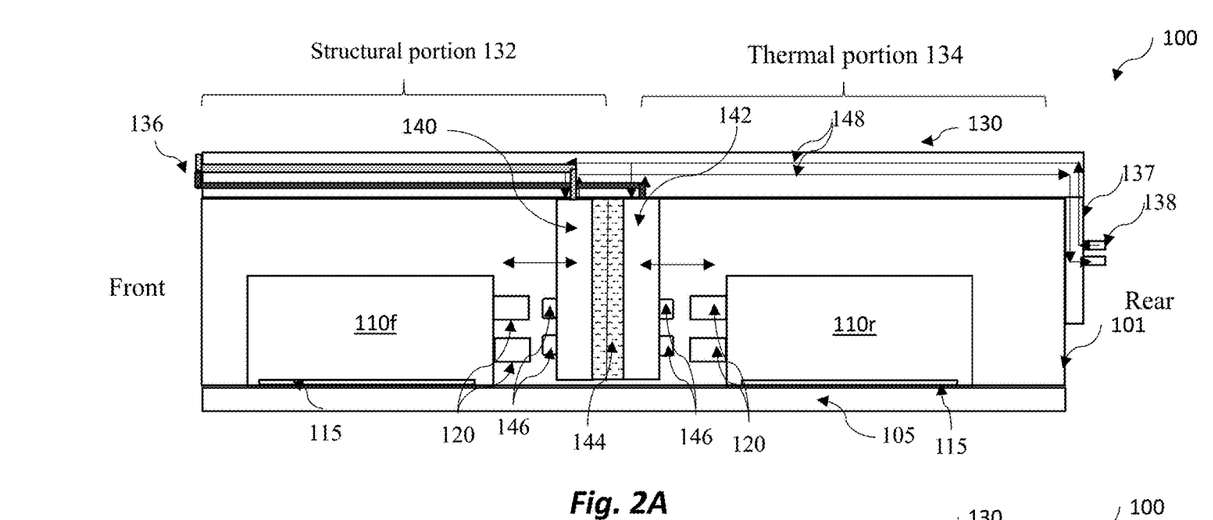
Figure 2B:
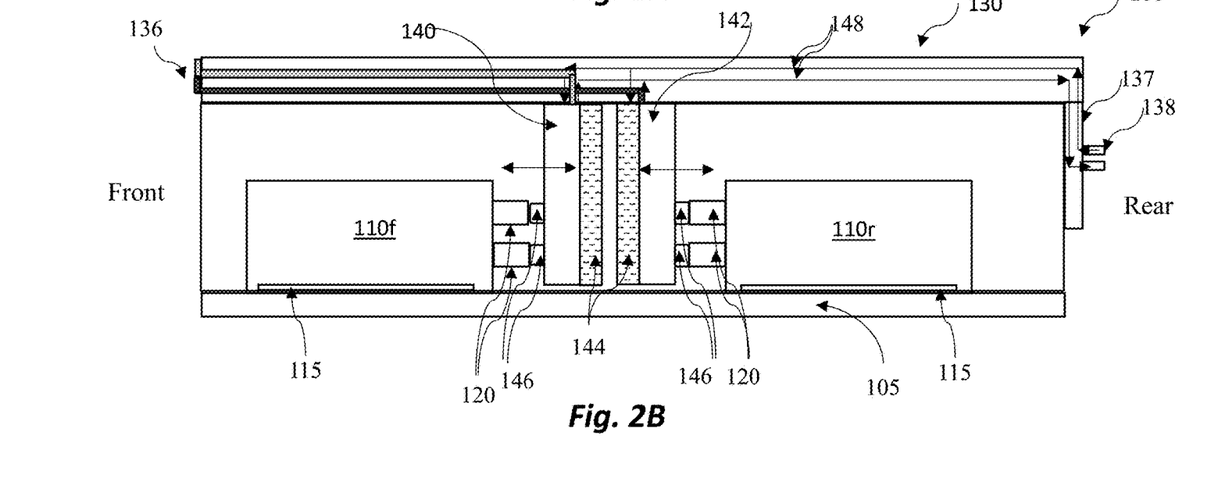
FIG. 2B illustrates the embodiment of FIG. 2A in a connected position.

FIG. 2A illustrate an embodiment that is a modified embodiment of FIG. 1. Specifically, the main connectors 138 are provided on a vertical extension 137. The vertical extension 137 enables to place the main connectors 138 in a vertical position that matches the corresponding connectors on the manifold of the rack. FIG. 2B illustrates the same embodiment as that of FIG. 2A, except that the connecting plates 140 and 142 have been moved using the engagement mechanism 136 so as to connect the mating connectors 146 to the corresponding receptacles, i.e., fluid connector 120.

Figure 3:
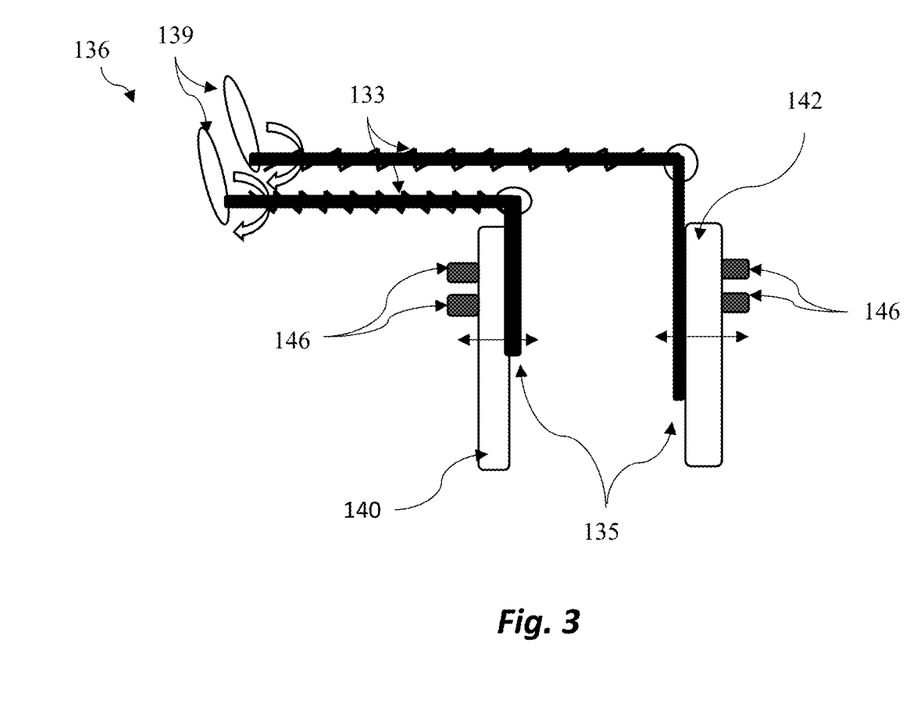
FIG. 3 illustrates a detailed view of an engagement mechanism according to an embodiment.

FIG. 3 is a diagram illustrating an embodiment of the engagement mechanism. In this example, the connector plates 140 and 142 are attached to engagement bars 135. The engagement bars 135 are movably coupled to engagement rods or linkages 133 and can be moved horizontally as exemplified by the double-headed arrows. The linkages 133 can be manually manipulated, e.g., rotated, using handles 139, as illustrated by the curved arrows. This mechanism may be implemented as any mechanical linkage arrangement, e.g., rack and pinion mechanism, wherein rotational motion of the engagement rods 133 is translated into linear motion of the engagement bars 135. Thus, by rotating the handles 139 at the engagement mechanism 136, a user is able to manually move the connector plates 140 and 142 so as to engage and disengage from the server nodes. Note that in the specific embodiment of FIG. 3 the intermediate plate 144 is eliminated. This means that the connector plates 140 and 142 are directly assembled onto the engagement structure via the engagement bars 135. Alternatively, the intermediate plate 144 may be used or the connector plates 140 and 142 may be designed as an integral part of the engagement structure, thus eliminating engagement bars 135.

By enabling engagement of the connector plates from the front of the chassis, no access to the back of the chassis is required. Consequently, this feature enables loading servers back to back, from the front and the rear of the rack, and connecting fluid cooling to all of the servers without the need to access the rear of each sever. This provides the ability of efficiently increase the server density on the rack. Also, since each server can be easily connected to liquid cooling by rotation of the handles 139, the process of connecting liquid cooling to server is vastly simplified. Moreover, by use of the connector plates, all of the connectors are automatically organized neatly, with easy identification of each fluid line leading to each server, rather than having the normal "spaghetti" morass of fluid lines, which makes identifying each line complex and time consuming.

Figure 4:
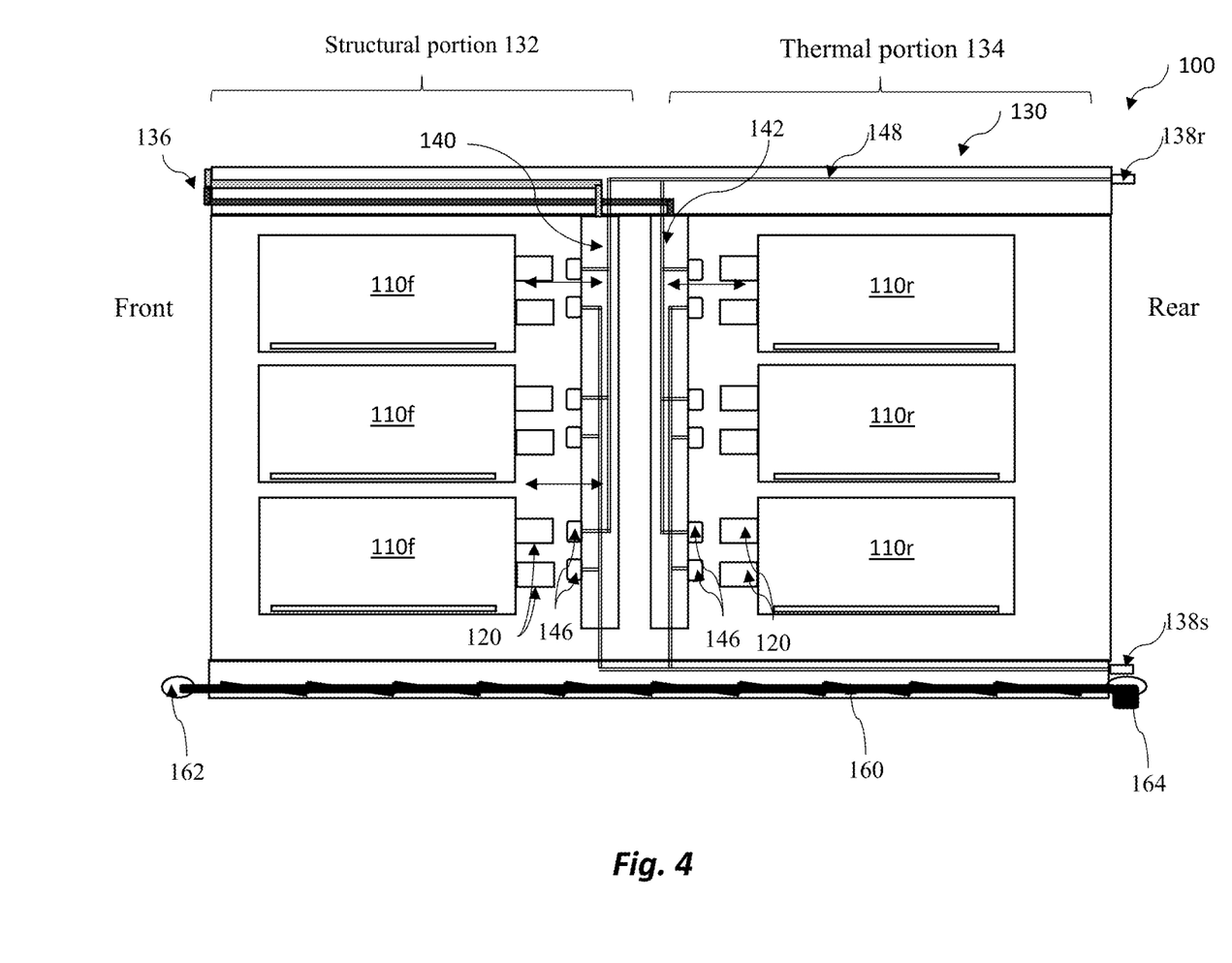
FIG. 4 is a top view schematic illustration showing various optional features that may be incorporated in any of the disclosed embodiments.

FIG. 4 is a top view and illustrates another embodiment highlighting optional features that may be incorporated in any of the other embodiments disclosed herein, individually or in combination. A first feature illustrated in FIG. 4 is that each of the connector plates 140 and 142 may provide fluid connection to multiple server nodes, especially when the servers are arrange horizontally side-by-side, but also when chassis is designed with height accommodating several servers vertically. Each of the connector plates has several pairs of connectors, each pair may be connected to one of the server nodes. The idea here is that regardless of the size of the chassis, the disclosed solution is sufficiently flexible to be integrated in any size chassis.

Another feature illustrated in FIG. 4 is that the main supply port 138*s* and main return port 138*r* are split. Here the main supply port 138*s* is positioned at one side of the chassis and the main return port 138*r* is provided at opposite side of the chassis. Fluid lines 148 connect between the ports 138s and 138r and the connectors 146. Again, the aim here is for flexibility—depending on the position of the ports of the rack's manifold, the main ports of the chassis may be designed to accommodate easy connection to the manifold. Also, each fluid distribution system requires only one pair of connections to the manifold, but can distribute the cooling fluid to many server nodes, thus reducing the number of required ports and connections on the manifold.

A further feature shown in FIG. 4 is the provision of rack locking mechanism 160. This feature is included in order to prevent accidental disconnection or dismounting of the chassis from the rack. The rack locking mechanism 160 has a locking handle 162 at the front of the chassis that, when rotated, engages a lock 164 onto a supporting plate of the rack (see FIG. 9). Thus, once locked, the chassis cannot be dismounted from the rack without disengaging lock 164 by counter-rotating the handle 162. In an embodiment, the main ports 138s and 138r can be designed at different locations on the rear side of the chassis 100, depending on the rack manifold locations. Main ports 138s and 138r are blind mating connectors in one embodiment, or may be manual mating connectors in another embodiment.

Figure 5:
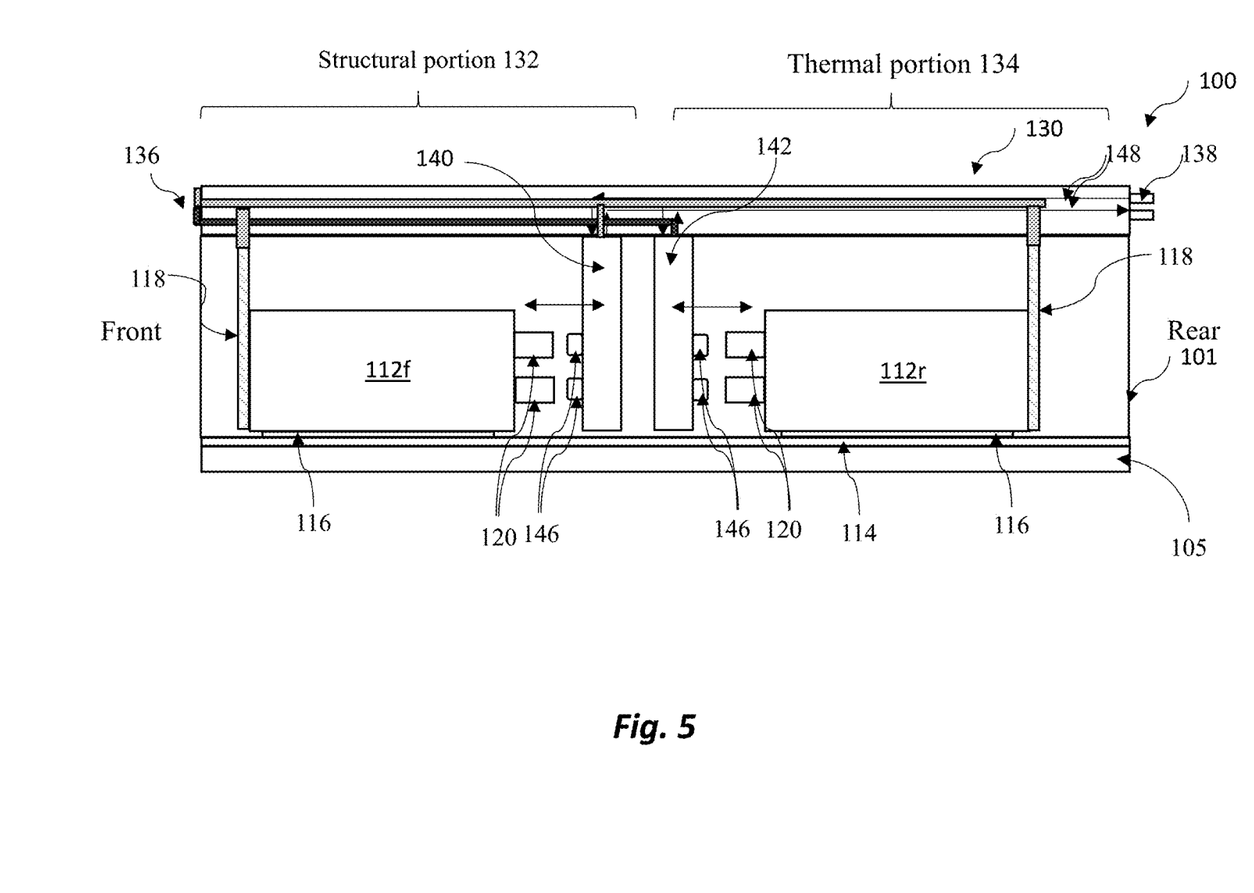
FIG. 5 illustrates an embodiment having the fluid distribution arrangement configured for devices with a peripheral component interconnect express (PCIE) bus implementation.

FIG. 5 illustrates an embodiment configured for accommodating multiple PCIE (Peripheral Component Interconnect Express) bus-connected boards. In FIG. 5 the main board 114 is mounted onto the chassis base 105. The main board 114 includes multiple PCIE bus slots 116. Each of the PCIE devices 112f and 112r is mounted onto one of the slots 116. The PCIE devices 112f and 112r includes high performance devices that require liquid cooling, and so the PCIE devices include supply and return ports 120. The supply and return ports 120 are connected to supply and return ports 146 by moving the connector plates 140 and 142 as explained with respect to the other embodiments. However, when the connector plates 140 and 142 move towards the PCIE devices 112f and 112r, they may exert pressure on the PCIE devices 112f and 112r sufficient to dislodge them from the PCIE slots 116. Accordingly, an anchor mechanism is provided to apply a counter-force and secure the PCIE devices 112f and 112r in their slots 116. The PCIE connection interface 116 is fragile, which means that the engagement of the fluid connectors need to be carefully designed. Based on this challenge, in the illustrated embodiment, the anchor mechanism is in a form of a securing plates 118, that exerts a counter force against the pressure imposed by the connector plates 112f and 112r.

Figure 6:
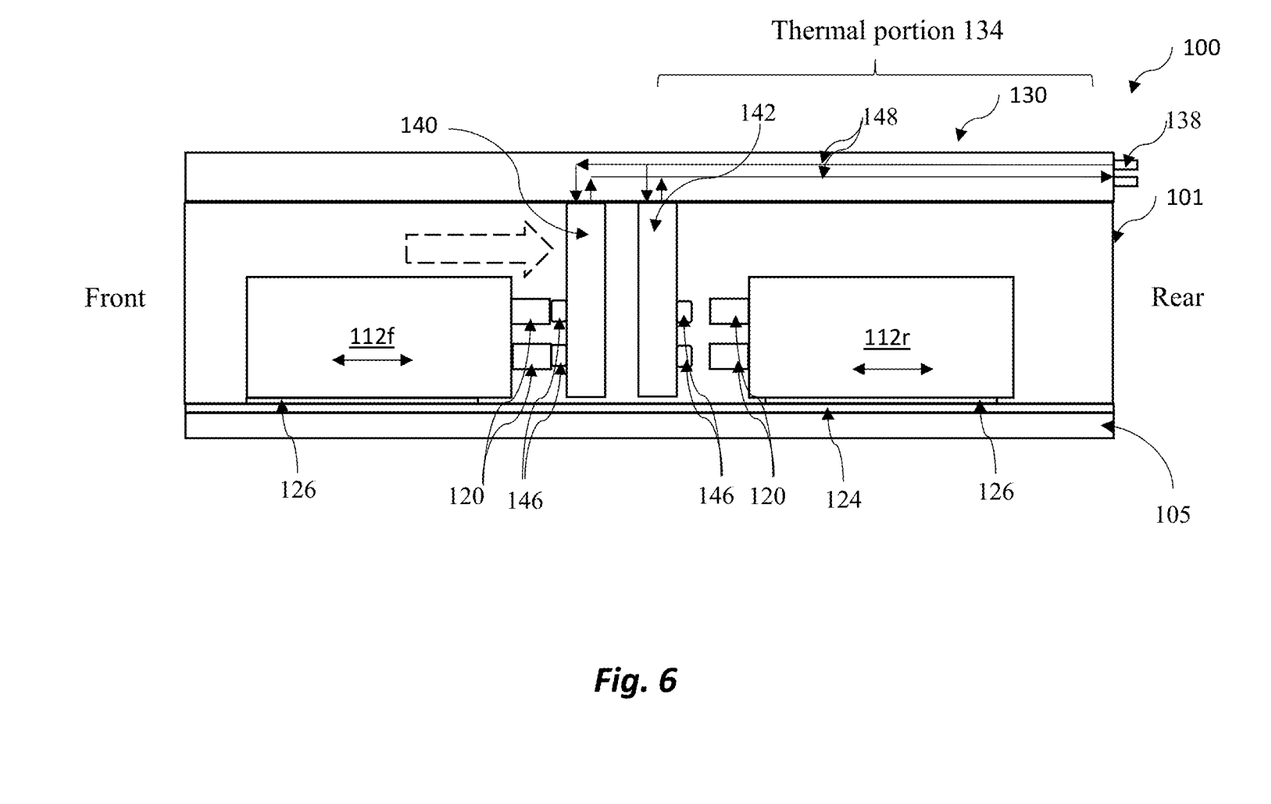
FIG. 6 illustrates an embodiment wherein the connector plates are stationary, while the devices can be slide to connect to the connector boards.

FIG. 6 illustrates an embodiment wherein the connector plates are fixed to the chassis in a stationary position. As illustrated in FIG. 6, the system does not include the structural portion, but only the thermal portion 134 with the connector plates 140 and 142. The connector plates 140 and 142 are fixed in the chassis and are connected to the main connectors 138 via fluid lines 148. Here, the electronic boards 112f and 112r can be moved along an integration panel 124 via coupling mechanism 126, so as to engage the connector plates. In the illustration, board 112f is shown connected to the connector panel 140, while board 112r is not yet connected. In one embodiment connecting the electronic boards 112f and 112r to the connector plate is performed manually. To accommodate this operation, the top of the fluid distribution module 130 is not fully covered to enable access to the electronic boards 112f and 112r from the top. This means that after the distribution module 130 is assembled to the chassis it does not block access to the boards (see top view of FIG. 4).

Figure 7:
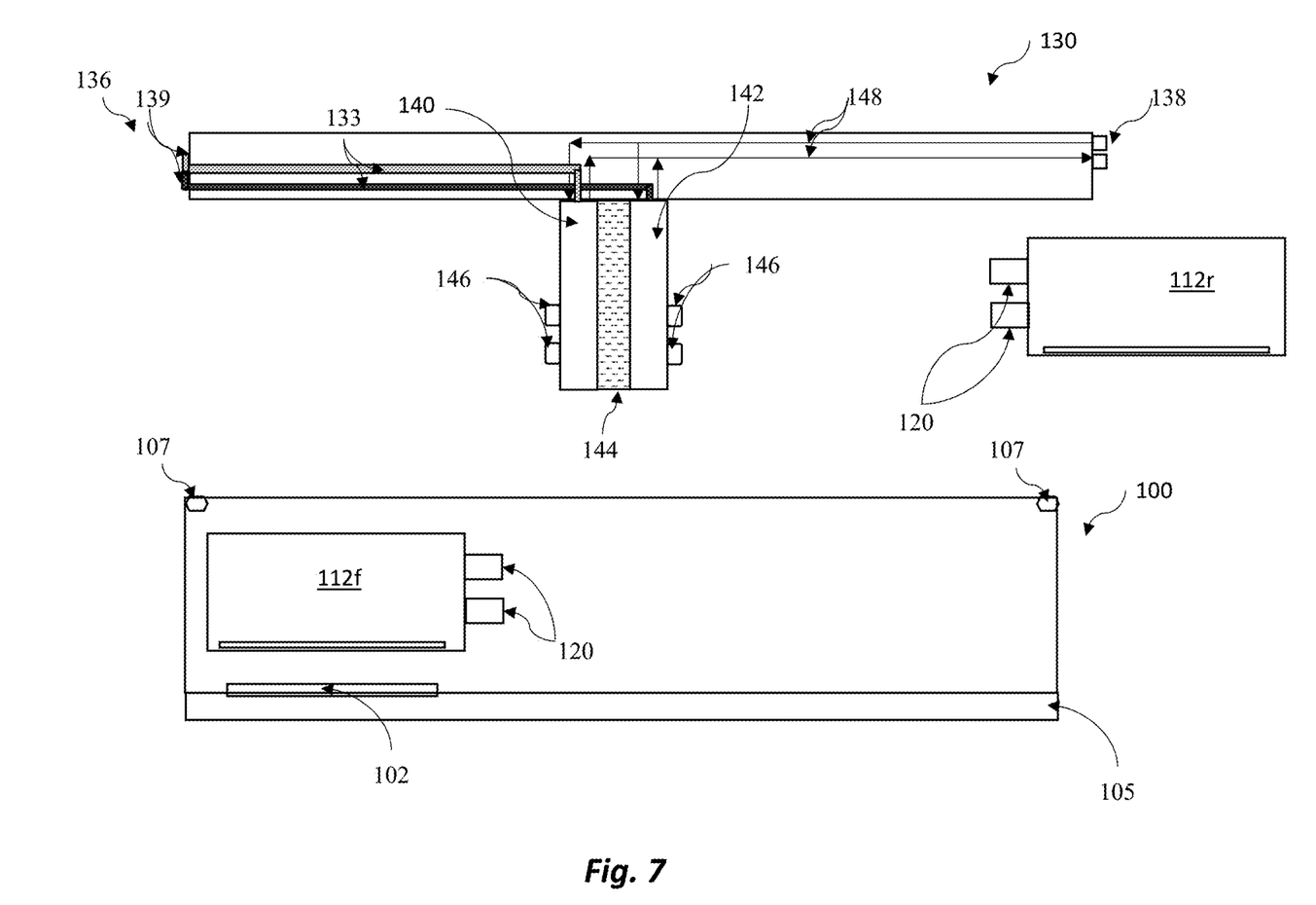
FIG. 7 illustrates an exploded view of the various parts of a chassis according to an embodiment.

FIG. 7 is an exploded illustration of the fluid distribution module 130, the chassis 100, and the server nodes 112, prior to assembly. The chassis 100 may be any standard chassis of any size, or a specially designed chassis. The chassis 100 may need to be modified to add mounting points 107 for mounting and securing the fluid distribution module 130 to the chassis 100. The fluid distribution module 130 may be according to any embodiment disclosed herein and may include the structural/mechanical elements and the thermal elements as explain herein. The connector plates may be attached directly to the engagement rods 133 or may be attached to intermediate plate 144. Once the fluid distribution module 130 is attached to the chassis 100, the server nodes 112 may be loaded and the connector plates may be moved to connect the fluid connectors 120 to the mating connectors 146. Here, element 102 may be a PCIE connection interface on the board or the installation slot for the electronic/server devices.

Figure 8:
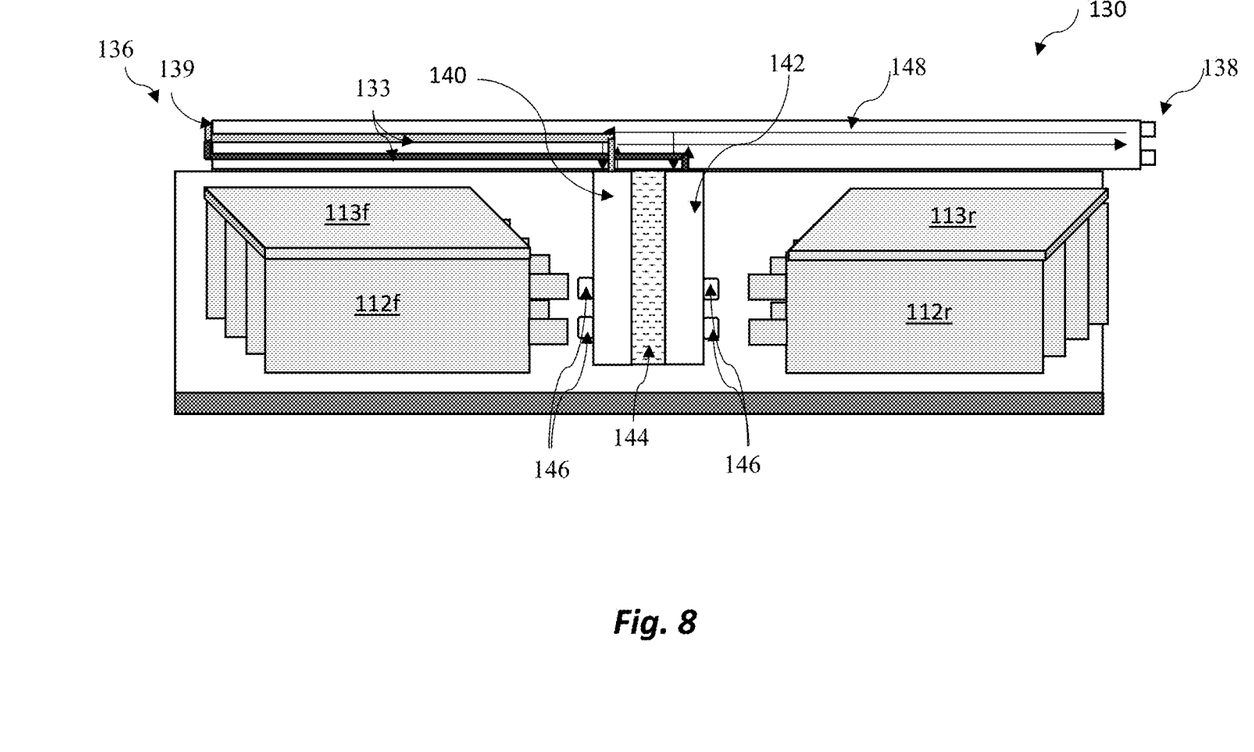
FIG. 8 illustrates an embodiment having multiple server boards mounted next to each other within the chassis, and having communication boards connected to the servers, according to an embodiment.

FIG. 8 is a partial isometric view of a chassis 100 having the fluid distribution module 130 connected to several server nodes 112 arranged horizontally side by side. As illustrated, on the front side of chassis 100 there are four server nodes 112f mounted one next to each other, and on the rear side there are four server nodes 112r mounted one next to each other. The front side also includes a front communication module 113f connected to all of the front server nodes 112f, and the rear side includes a rear communication module 113r connected to all of the rear server nodes 112r. The connector plates 140 and 142 are shown head-on, so that only one pair of mating connectors 146 are shown, but it should be appreciated that each plate has four pairs of mating connector to connect to all of the server nodes. This architecture provides an efficient design for high power density servers which include multiple homogeneous and/or nonhomogeneous server nodes, with and advanced communication connection via the communication modules 113f and 113r.

Figure 9:
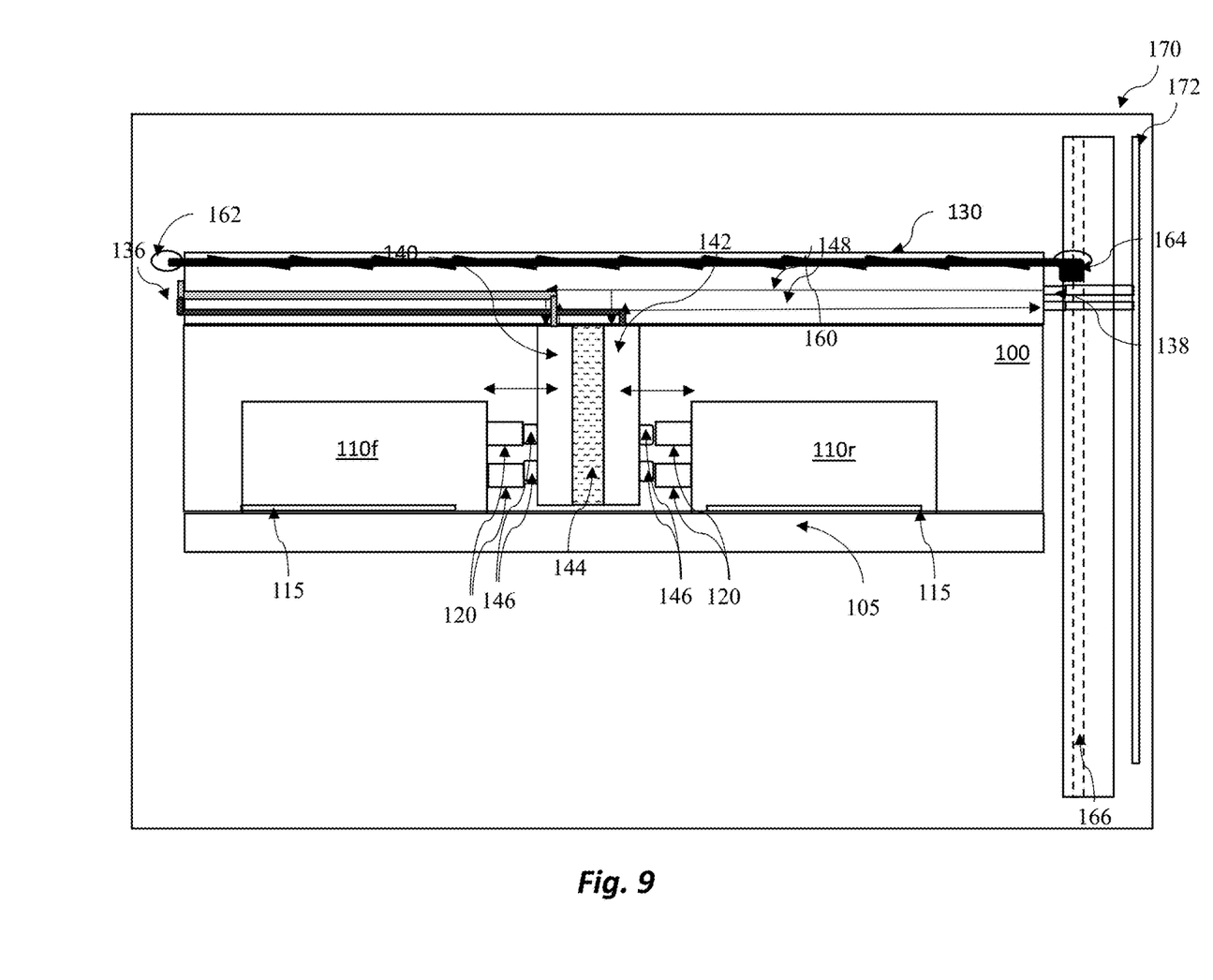
FIG. 9 illustrates the chassis mounted onto a rack, according to an embodiment, which represents an overall schematic of the fluid distribution solution.

FIG. 9 illustrates an embodiment of a chassis 100 with the fluid distribution module 130 mounted onto a rack system 170. The main fluid connectors 138 are connected in the rear to the rack's manifold 172, which is in turn connected to a cooling system in a well-known manner. Thus, the fluid from the rack's manifold 172 is circulated through all of the server nodes using the simple one pair connection of the main fluid connectors 138. This avoids having the run multitudes of hoses from the manifold to each of the servers, which makes installation and maintenance complex and prone to errors and leakage failures. Instead, the entire fluid distribution module 130 can be checked and verified prior to installation of the servers, to ensure reliability. Then, when the servers are loaded, the connections are performed by simple manipulation of the handles 139, making the fluid connection process very simple and orderly. If desired, all these connections can be checked prior to mounting the chassis onto the rack. Finally, upon mounting the chassis to the rack, only one pair of connections to the rack's manifold are needed, making the entire process simple and reliable.

FIG. 9 also illustrates the optional rack locking mechanism 160. The handle 162 can be used to engages the lock 164 onto the supporting plate 166 of the rack 170, thus preventing accidental dismount of the chassis. This acts as a further safety measure to prevent leakage from the liquid cooling system.

The disclosed embodiments thus provide for an apparatus for fluid distribution for server chassis, wherein a linkage system is configured to be mounted on the chassis and at least one connector plate is coupled to the linkage system.

The connector plate has at least one pair of fluid connectors and a plurality of fluid lines are coupled between main fluid connectors and the at least one pair of fluid connectors. The main fluid connectors are configured for connection to a rack manifold for fluid circulation. In some disclosed embodiments two connector plates are positioned in the center of the chassis, and the linkage system is operable to alternatingly move the two connector plates towards and away from each other so as to connect the paired fluid connectors to fluid cooling ports of electronic boards.

Further disclosure provides a chassis housing having a front side, a rear side, and a base for supporting electronic boards mountable in the chassis. A first connector plate having at least one pair of front facing fluid connectors is mounted in a mid-section of the chassis housing. A second connector plate having at least one pair of rear facing fluid connectors is mounted in the mid-section of the chassis housing. A pair of main connectors is positioned at the rear side of the chassis and a plurality of fluid lines are connected between the pair of main connectors, the front facing fluid connectors, and the pair of rear facing fluid connectors.

A method for providing fluid distribution within a chassis is provided, wherein a fluid distribution module is attached onto the chassis, the fluid distribution module having connector plates mounted onto linkage system and having fluid lines connected between fluid connectors positioned on the connector plates and main connectors mounted onto a rear side of the chassis. Server boards are mounted onto the chassis and then the linkage system is manipulated so as to translate the connector plate to attach the fluid connectors to receptacles on the electronic board. Also, the main connectors are connected to a fluid manifold.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An apparatus for fluid distribution for server chassis, comprising:
   a linkage system configured to be mounted on the chassis;
   a connector plate coupled to the linkage system, the connector plate having at least one pair of fluid connectors facing one direction;
   a plurality of main fluid connectors configured for connection to a manifold for fluid circulation; and
   a plurality of fluid lines coupled between the main fluid connectors and the at least one pair of fluid connectors.

2. The apparatus of claim 1, wherein the linkage system is operable to horizontally translate the connector plate.

3. The apparatus of claim 1, having two connector plates positioned in a substantial center of the chassis, and wherein the linkage system is operable to alternatingly move the two connector plates towards and away from each other.

4. The apparatus of claim 1, further comprising an intermediate board coupled to the linkage system and configured to accept different connector plates, and wherein the at connector plate is attached to an intermediate plate.

5. The apparatus of claim 1, wherein the connector plate has a plurality of pairs of dripless fluid connectors.

6. The apparatus of claim 1, further comprising a rack locking mechanism configured for mechanically locking the chassis to a server rack.

7. The apparatus of claim 1, further comprising an anchor configured to mechanically secure an electronic board mounted in the chassis.

8. The apparatus of claim 1, further comprising an integration panel mounted in the chassis and configured to enable sliding of an electronic board mounted in the chassis.

9. A server chassis, comprising:
   a chassis housing having a front side, a rear side, and a base for supporting electronic boards mountable in the chassis;
   a first connector plate having at least one pair of front facing fluid connectors, the first connector plate mounted in a mid-section of the chassis housing;
   a second connector plate having at least one pair of rear facing fluid connectors, the second connector plate mounted in a mid-section of the chassis housing;
   a pair of main connectors positioned at the rear side; and
   a plurality of fluid lines connected between the pair of main connectors, the at least one pair of front facing fluid connectors, and the at least one pair of rear facing fluid connectors.

10. The server chassis of claim 9, further comprising a linkage system configured to translate the first connector plate and the second connector plate.

11. The server chassis of claim 10, further comprising an intermediate board coupled to the linkage system and configured to accept different connector plates, and wherein the first connector plate and the second connector plate are attached to an intermediate plate.

12. The server chassis of claim 9, wherein the first connector plate has a plurality of front facing fluid connectors and the second connector plate has a plurality of pairs of rear facing fluid connectors.

13. The server chassis of claim 9, further comprising a rack locking mechanism configured for mechanically locking the chassis to a server rack.

14. The server chassis of claim 13, wherein the rack locking mechanism comprises a locking handle operable to engage a lock onto the server rack.

15. The server chassis of claim 9, further comprising an anchor configured to mechanically secure an electronic board mounted in the chassis.

16. The server chassis of claim 15, wherein the anchor comprises two securing plates, each configured to oppose a force exerted by the first connector plate or the second connector plate.

17. The server chassis of claim 9, further comprising an integration panel mounted in the chassis and configured to enable sliding of an electronic board mounted in the chassis.

18. A method of providing fluid distribution in a server chassis, comprising:
   attaching a fluid distribution module onto the chassis, the fluid distribution module having a connector plate mounted onto linkage system and having fluid lines connected between fluid connectors positioned on the connector plate and main connectors mounted onto a rear side of the chassis;
   mounting an electronic board onto the chassis;
   operating the linkage system so as to translate the connector plate to thereby attach the fluid connectors to receptacles on the electronic board; and
   connecting the main connectors to a fluid manifold.

19. The method of claim 18, further comprising activating a locking mechanism to mechanically lock the chassis to a server rack.

20. The method of claim 18, further comprising applying supportive force to the electronic board while operating the linkage system to prevent the connector plate from dismounting the electronic board.

* * * * *